United States Patent [19]
Goto et al.

[11] Patent Number: 5,155,906
[45] Date of Patent: Oct. 20, 1992

[54] PROCESS FOR REPAIRING CIRCUIT CONNECTIONS

[75] Inventors: Yasushi Goto, Shimodate; Atsuo Nakajima, Ibaraki; Isao Tsukagoshi, Shimodate; Tomohisa Ohta, Tochigi; Yutaka Yamaguchi, Yuki, all of Japan

[73] Assignee: Hitachi Chemical, Ltd., Tokyo, Japan

[21] Appl. No.: 672,110

[22] Filed: Mar. 19, 1991

[30] Foreign Application Priority Data

Mar. 29, 1990 [JP] Japan .................................. 2-081984

[51] Int. Cl.⁵ .............................................. H05K 3/10
[52] U.S. Cl. ..................................... 29/846; 29/402.03
[58] Field of Search ............. 29/846, 402.03; 156/98; 174/259

[56] References Cited

U.S. PATENT DOCUMENTS 5,019,944  5/1991  Ishii et al. ........................... 174/259

Primary Examiner—P. W. Echols
Attorney, Agent, or Firm—Antonelli, Terry Stout & Kraus

[57] ABSTRACT

Circuit connections can be repaired with high accuracy and high reliability by peeling a mutually connected circuit portion to be repaired and placing a porous sheet with predetermined shape on the peeled circuit surface, impregnating the porous sheet with a peeling solution, removing the porous sheet containing unnecessary adhesive dissolved by the peeling solution, while cleaning the circuit surface contacted with the peeling solution, and reconnecting the cleaned circuit surface to a circuit surface to be connected via an adhesive.

5 Claims, 1 Drawing Sheet

PROCESS FOR REPAIRING CIRCUIT CONNECTIONS

BACKGROUND OF THE INVENTION

The present invention relates to a process for repairing circuit connections.

As electronic parts have become smaller and thinner, the circuits formed therein have achieved higher density and are finer. In connecting these fine circuits, the use of conventional connecting material such as solder, rubber connector or the like is inappropriate, so that in recent years, an adhesive or a film (each being hereinafter referred to as a connecting member) exhibiting anisotropic electric conductivity has come to be used widely. In connecting fine circuits with this connecting member, a connecting member layer consisting of an adhesive containing a given proportion of an electric conductive material is provided between two circuit groups opposed to each other; pressure or pressure and heat is or are applied to establish electrical connection between each two opposing circuits of the two circuit groups and simultaneously to impart electrical insulation between adjacent circuits; thus, the two circuit groups opposed to each other are adhered and fixed.

As the film-shaped material having anisotropic electric conductivity only in the thickness direction according to the prior art, there is a sheet-shaped structure having electric conductivity in the thickness direction via electric conductive particles, obtained by dispersing electric conductive particles in a non-conductive resin so that the particles make no contact with each other and then shaping the dispersion into a sheet having substantially the same thickness as the diameter of the electric conductive particles, as disclosed in, for example, Japanese Patent Kokai No. 51-21192. Also, there is an attempt of connecting two opposing circuit groups by adhering and fixing the groups in contact with each other by the use of an insulating adhesive containing no conductive particles (e.g. Japanese Patent Examined Publication No. 46-43732).

In connection by these connecting members, when electrical connection is poor or when electronic parts or circuits become faulty after the connection, there is employed a process comprising tearing up each two connected circuits, removing the connecting member remaining on the circuits with a solvent or the like, and reconnecting the cleaned circuits with a fresh connecting member of the same type.

Also, in adhering a housing or other parts to an electronic part having unconnected circuits, with an adhesive, when the adhesive has been mistakenly adhered to the unconnected circuits and consequently the later connection is inadvertent, there is employed a process comprising wiping off the adhesive adhering to the unconnected circuits, with a cloth or a swab both impregnated with a solvent or the like.

In the above-mentioned processes for removing the adhesive, however, the partial removal of the adhesive is extremely difficult. For example, a connecting member of anisotropic electric conductivity is also used in connecting a number of electronic parts to a large-sized electronic part having a number of circuits; when part of the electronic parts connected to the large-sized electronic part is repaired, there are problems in that the above removal of the adhesive adversely affects the other connecting member(s), resulting in incurring poor connection and reduced reliability. For example, in connection of electronic parts generally used in a liquid crystal display material, as shown in FIG. 1(a), wherein ITO circuits on a glass substrate 1 are connected with a number of FPC substrates 2 by the use of a connecting member of anisotropic electric conductivity, there are used very fine circuits of, for example, 100 μm, in width for each conductor (circuit) and 100 μm, in distance, between two adjacent conductors; further, the distance between the two adjacent FPC circuits is as small as several hundreds of microns in some cases as a result of recent trend of lighter weight, smaller thickness and smaller size in electronic parts. In order to remove one of the FPC substrates 2 shown in FIG. 1(a) and effect reconnecting, that FPC circuit is peeled and the connecting member remaining on the glass substrate is removed by the above-mentioned conventional method of, after decomposition or dissolution, wiping off with a swab impregnated with a peeling solution, infiltration of the peeling solution to the adjacent FPC circuits is unavoidable, that is, even the connecting members of the adjacent FPC circuits are decomposed or dissolved and there are possibilities of an increase in connection resistance and reduction in reliability of connection.

In the above-mentioned conventional methods for removal of adhesive or connecting member, it is possible to use, in combination, a method of using an adhesive masking tape or the like to protect the portion not to be removed, from the peeling solution. In this case, however, the adhesive in the masking tape is decomposed or dissolved by the peeling solution, resulting in an unavoidable increase in connection resistance and a reduction in the reliability of connection.

SUMMARY OF THE INVENTION

The present invention has been made in order to overcome such drawbacks of the prior art.

The present invention provides a process for repairing poor electrical conductive portions in circuit connections obtained by connecting a number of circuits facing each other via an adhesive, which comprises:

(1) a step of peeling a mutually connected portion of a circuit connected portion to be repaired and placing a porous sheet of predetermined shape on the surface of an adhesive remaining on at least one circuit surface, (2) a step of impregnating the porous sheet with a peeling solution so as to temporarily contact the peeling solution with the adhesive, (3) a step of removing the porous sheet containing the peeling solution, thereby cleaning the circuit surface contacted with the peeling solution, and (4) a step of reconnecting the cleaned circuit surface to a circuit surface of another circuit substrate with an adhesive.

DESCRIPTION OF THE PREFERRED EMBODIMENTS

Figure 1A:
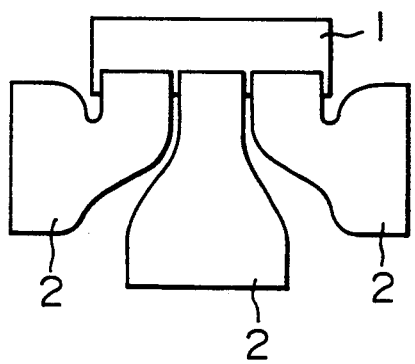
FIGS. 1(a) to 1(f) are schematic views illustrating the process of the present invention.

The present invention resides in a process for repairing circuit connections, which enables reconnection with significantly improved reliability by allowing a peeling solution to act only on the areas requiring the removal of adhesive and thereby preventing the other areas from being impregnated with the peeling solution.

The present invention is hereinafter described in detail.

The porous sheet used in the present invention is a sheet having fine porous. The pores sheet has no particular restriction as long as it allows the infiltration of a peeling solution into its entirety by a capillary action in a short period of time. The surface of the porous sheet is contacted with the adhesive remaining on the circuits of the circuit connections to be repaired, whereby the peeling solution contained in the pores of the porous sheet infiltrates into the adhesive; therefore, pores with large diameters make it difficult to accurately set the contact area between the porous sheet and the adhesive. Hence, the diameters of the pores are preferably 100 μm or less. If necessary, the surface area of the porous sheet opposite to a surface to be contacted with the remaining adhesive can be sealed in order to ensure no leakage of the peeling solution from the sealed area, whereby the area of the adhesive to be removed can be limited accurately.

The sealing of the porous sheet surface can be effected, for example, by heat-melting the porous sheet surface or adhering to the porous sheet surface a coating or a resin film which is not attacked by the peeling solution, thereby sealing the surface area of the porous sheet not to be contacted with the adhesive.

Specific examples of the porous sheet include fibrous materials such as paper, glass and the like; a non-woven fabric; a porous polytetrafluoroethylene; porous sheets obtained by sintering a thermoplastic resin (e.g. polyethylene); a urethane foam having fine open celled pores, etc. Of these, a porous sheet obtained from a thermoplastic resin is preferable due to the easy surface coating mentioned above by melting or by adhering the film with heating.

The peeling solution used in the present invention can be any suitable solution as long as it can decompose or dissolve the adhesive. As the peeling solution, there can be mentioned, for example, organic solvents such as toluene, alcohols, ketones and the like; organic acids such as formic acid, acetic acid and the like; inorganic acids such as hydrochloric acid, sulfuric acid and the like; and solutions of alkali compounds such as sodium hydroxide, potassium hydroxide and the like. They can be used singly or in appropriate combination, or in a solution with an appropriate solvent.

The use of a peeling solution of low viscosity and good wettability against the porous sheet is preferable because such a peeling solution has good infiltrability into the porous sheet.

The adhesive to which the present invention is applicable has no particular restriction as long as it can be decomposed or dissolved by the peeling solution. The present invention is applicable to, for example, thermoplastic resins such as vinyl acetate resin, polypropylene and the like; highly heat-resistant resins such as polyethersulfone, polyimide, polysulfone and the like, and thermosetting resins such as epoxy resin and the like.

Among these adhesives, the present invention is particularly effective for an adhesive having a cross-linked structure, because other methods are difficult to use with such an adhesive while in the present invention the time of contact of peeling solution with adhesive can be made sufficiently long.

In the present invention, the adhesive which has been decomposed or dissolved by the peeling solution, is infiltrated or drawn into the porous sheet and removed. When the removal of the decomposed or dissolved adhesive is not sufficient, the complete removal can be effected by wiping off the residual adhesive with a dry cloth, a dry paper, a dry swab or the like, or with an appropriate material impregnated with a solution incapable of decomposing or dissolving the adhesive.

In the step of mounting or plating the porous sheet of the present invention accurately on the site requiring adhesive removal, coating partially or wholly a part, i.e., the front side or back side, of the porous sheet surface with an adhesive can impart temporary adhesion to the porous sheet, whereby the operator conducting the repair can easily confirm the site for mounting and the operation efficiency is improved. It is preferable to use an adhesive which can be decomposed or dissolved by the peeling solution, because such an adhesive can be removed together with the adhesive remaining on the circuit surface by the peeling solution infiltrated or impregnated into the porous sheet. As the adhesive, there can be used, for example, a rubber-based adhesive, an acrylic resin-based adhesive, or a water-based adhesive.

During or after removing the porous sheet containing the peeling solution for dissolving the adhesives, the circuit surface contacted with the peeling solution is cleaned by a conventional process.

Repairing is completed by connecting, to the thus cleaned circuit surface, a cleaned circuit surface of the other circuit substrate or a circuit of a new substrate, with an adhesive.

In this case, when the adhesive contains hard electric conductive particles, the electric conductive particles can pierce the residual adhesive layer and thereby can establish electrical conduction; accordingly, the circuit substrates separated by mechanical tear-up in the first step can be used in reconnection as they are. This is effective for reduction in repairing cost.

According to the present invention, the peeling solution contained in the pores of the porous sheet infiltrates into the portion of the adhesive with which the porous sheet surface is contacted, and dissolves or decomposes this adhesive portion, so that only the desired adhesive portion is removed accurately and the above-mentioned problems are solved.

When the porous sheet is sealed at the end and/or the surface opposite to the surface to be contacted with the adhesive, the spreading of the peeling solution to the adjacent areas can be prevented. Moreover, the porous sheet has excellent workability because it is a sheet, enables adhesive removal operation in a short period of time, and makes automation of removal operation easily.

The present invention is hereinafter described specifically by way of Examples, in which all parts and percents are by weight, unless otherwise specified.

EXAMPLE 1

On one side of a sintered sheet (thickness: 0.4 mm, pore diameter: 30 μm) made from polyethylene particles of 50 μm in particle diameter was melt-laminated a polyethylene film. The other side of the sintered sheet was coated with an acrylic resin type adhesive to obtain a porous sheet. The porous sheet was cut by a hot knife of 200° C. to prepare a porous sheet of 10 mm in width and 20 mm in length.

On the other hand, three FPC substrates 2 (each having circuit width of 100 μm and circuit distance of 100 μm) having a connecting width of 10 mm were electrically connected to terminal portions of ITO circuits 11 formed on a glass substrate 1 using an adhesive film of anisotropic electric conductivity [Anisolm AC-6071 (trade name), an epoxy type product manufactured by Hitachi Chemical Co., Ltd., 20 μm in thickness] as shown in FIG. 1(a).

Figure 1D:
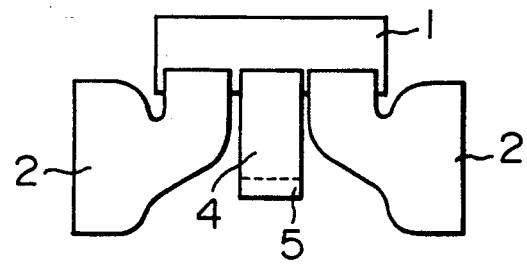
Figure 1B:
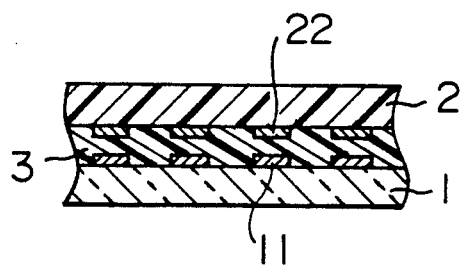

FIG. 1(b) is a cross-sectional view of the thus obtained connection wherein the ITO circuits 11 on the glass substrate 1 are connected to the circuits 22 on the center FPC substrate 2 with the adhesive 3 of anisotropic electric conductivity so as to establish electrical conduction.

Figure 1E:
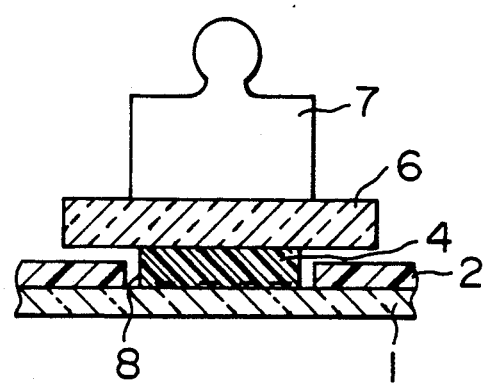
Figure 1C:

Among the three FPC substrates, the center FPC substrate was mechanically peeled off. FIG. 1(c) shows the state of the location from which the center FPC substrate has been removed, wherein the cured adhesive 3 was solidly adhered onto the ITO circuits. The glass substrate having no center FPC substrate was used for a test according to the process of the present invention.

Next, as shown in FIG. 1(d), the porous sheet 4 prepared above and having a coated adhesive layer at the bottom was temporarily adhered onto the adhesive to be removed. Then, as shown in FIG. 1(e), which figure omits the circuits 11 and 12 and adhesive 3 between the left and right FPC substrates 2 and glass substrate 1 for simplicity, a glass plate 6 was placed on the porous sheet 4, and a weight 7 was placed thereon for fixing.

Under this state, the end portion 5 of the porous sheet 4 in a distance of about 3 mm from the end [see FIG. 1(d)] was immersed in a peeling solution [Sun Econ G-430 (trade name), a product of Taiyo Kako K.K.] capable of decomposing the adhesive, whereby the peeling solution was infiltrated into the whole part of the porous sheet.

Figure 1F:
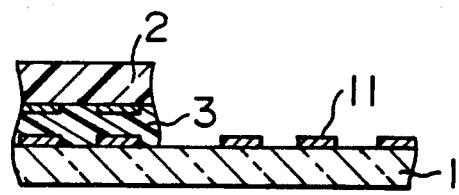

Under this state, the peeling solution was infiltrated from the porous sheet into the adhesive for about 10 seconds; then, the porous sheet was removed; the decomposed adhesive was appropriately wiped off with a Teflon-made spatula; the residual adhesive was wiped off with a swab impregnated with methanol, whereby as shown in FIG. 1(f), which figure shows a portion of the left FPC substrate 2 and a portion of the location from which the center FPC substrate 2 was removed, the adhesive portion to be removed was completely removed and the ITO circuits 11 therebeneath were completely exposed. Since the pores at the sides 8 of the porous sheet 4 were sealed by the hot knife, there was no leakage of the peeling solution from the porous sheet and accordingly there was seen no infiltration of the peeling solution into the adjacent circuits.

After the above removal of the adhesive, new FPC substrates were connected to the cleaned ITO circuits of the glass substrate with Anisolm AC 6071. After the reconnection, the connection resistance of each FPC circuit was measured. The difference in connection resistance between FPC circuits after reconnection and corresponding FPC circuits before adhesive removal, and the difference in connection resistance between adjacent FPC circuits after reconnection and corresponding adjacent FPC circuits before adhesive removal were $\pm 0.5 \Omega$ or less; thus, there was no increase in resistance by reconnection.

EXAMPLE 2

The same procedure as in Example 1 was repeated except that the peeling solution used in Example 1 was changed to a mixture consisting of 74 parts of methylene chloride, 20 parts of formic acid, 5 parts of chloroacetic acid and 1 part of glycerine. There was no increase in connection resistance, either.

EXAMPLE 3

The same procedure as in Example 1 was repeated except that there was used, as the porous sheet of 0.5 mm in thickness, a laminate obtained by melt-adhering a polyethylene film to one side of a cellulose-made filter paper specified by JIS P 3801, or 5 μm in retained particle diameter and coating the other side of the filter paper with an acrylic resin-based adhesive. There was no increase in connection resistance, either.

COMPARATIVE EXAMPLE

The adhesive removal in the above Examples was effected by sliding a swab impregnated with Sun Econ G-430, over the adhesive to decompose the adhesive, then appropriately wiping off the decomposed adhesive with a Teflon-made spatula, and wiping off the residual adhesive with a swab impregnated with methanol.

Then, as in the above Examples, new FPC substrates were reconnected to the cleaned ITO circuits, and the connection resistance of each FPC circuit was measured.

As a result, the difference in connection resistance between reconnected FPC circuits and corresponding FPC circuits before adhesive removal was $\pm 0.5 \Omega$ or less, and there was no increase in resistance. However, the connection resistances of FPC circuits adjacent to reconnected FPC circuits increased from the terminals adjacent to reconnected FPC circuits and, out of the total circuits of two FPC substrates adjacent to reconnected FPC circuits, 25 circuits showed a resistance increase of 100 $\Omega$ or more.

As described in detail above, the present invention can conduct removal of adhesive of strictly specified area and accordingly enables repair of circuit connections with high accuracy and high reliability.

What is claimed is:

1. A process for repairing poor electrical conductive portions in circuit connections obtained by connecting a number of circuits facing each other by an adhesive, which comprises:
    (1) a step of peeling away a mutually connected portion of a circuit connected portion to be repaired and placing a porous sheet of predetermined shape on a surface of an adhesive remaining on at least one circuit surface,
    (2) a step of impregnating the porous sheet with a peeling solution so as to temporarily contact the remaining adhesive with the peeling solution,
    (3) a step of removing the porous sheet containing the peeling solution, thereby cleaning the circuit surface with the peeling solution, and
    (4) a step of reconnecting the cleaned circuit surface to a circuit surface of another circuit substrate with an adhesive.

2. A process according to claim 1, wherein the porous sheet is previously subjected to a sealing process on the surface opposite to a surface to be contacted with remaining adhesive and/or to end portions thereof.

3. A process according to claim 1, wherein the porous sheet is coated with an adhesive partially or wholly on the front side or back side thereof to enable accurate placement of the porous sheet.

4. A process according to claim 1, wherein during cleaning of the circuit surface, adhesive dissolved or decomposed by the peeling solution infiltrates into said porous sheet.

5. A process according to claim 4 further comprising, after the step of removing the porous sheet, a step of wiping off any residual adhesive from the circuit surface.

* * * * *